US012604542B2

(12) United States Patent
Huang

(10) Patent No.: US 12,604,542 B2
(45) Date of Patent: Apr. 14, 2026

(54) MULTI-ETCH DETECTOR PIXELS FABRICATION AND ASSOCIATED IMAGING SYSTEMS AND METHODS

(71) Applicant: Teledyne FLIR Commercial Systems, Inc., Goleta, CA (US)

(72) Inventor: Edward K. Huang, Newbury Park, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 587 days.

(21) Appl. No.: 17/558,506

(22) Filed: Dec. 21, 2021

(65) Prior Publication Data

US 2022/0123042 A1      Apr. 21, 2022

Related U.S. Application Data

(63) Continuation of application No. PCT/US2020/039699, filed on Jun. 25, 2020.

(60) Provisional application No. 62/867,188, filed on Jun. 26, 2019.

(51) Int. Cl.
*H10F 39/00*        (2025.01)
*H10F 39/18*        (2025.01)

(52) U.S. Cl.
CPC ......... *H10F 39/011* (2025.01); *H10F 39/184* (2025.01); *H10F 39/807* (2025.01)

(58) Field of Classification Search
CPC .... H10F 39/011; H10F 39/184; H10F 39/807; H01L 27/14683; H01L 27/14649
See application file for complete search history.

(56) References Cited

U.S. PATENT DOCUMENTS

| | | | | |
|---|---|---|---|---|
| 9,818,896 | B1 | 11/2017 | De Lyon et al. | |
| 2012/0273838 | A1* | 11/2012 | Kinch | H10F 39/184 |
| | | | | 438/94 |
| 2013/0020666 | A1* | 1/2013 | Smith | H10F 77/10 |
| | | | | 257/E31.093 |
| 2015/0097157 | A1* | 4/2015 | Onakado | H10F 77/124 |
| | | | | 257/21 |

(Continued)

OTHER PUBLICATIONS

Smith, Edward P. et al., "Two-color HGCdTe infrared staring focal plane arrays," Dec. 8, 2003, p. 1, vol. 5209, *SPIE Proceedings*, US DOI: 10.1117/12.507811ISBN: 978-1-5106-3673-6.

(Continued)

*Primary Examiner* — Aaron J Gray
(74) *Attorney, Agent, or Firm* — Haynes and Boone, LLP

(57)        ABSTRACT

Techniques are disclosed for facilitating multi-etch detector pixels fabrication. In one example, a method includes forming a semiconductor structure. The semiconductor structure includes a substrate layer, an absorber layer disposed on the substrate layer, a barrier layer disposed on the absorber layer, and a first contact layer disposed on the barrier layer. The method further includes forming the pixels from the semiconductor structure. The forming of the pixels includes performing a first etching operation to remove a portion of at least the first contact layer, and performing a second etching operation to remove a portion of the barrier layer and a portion of the absorber layer. Each of the pixels includes a respective portion of each of the substrate layer, the first contact layer, the barrier layer, and the absorber layer. Related systems and devices are also provided.

15 Claims, 10 Drawing Sheets

(56) References Cited

U.S. PATENT DOCUMENTS

2016/0307956 A1* 10/2016 Klipstein ............. H10F 77/146
2020/0219908 A1* 7/2020 Minari ................. H10F 39/807

OTHER PUBLICATIONS

International Search Report and Written Opinion dated Oct. 21, 2020 in Intl Application No. PCT/US2020/039699 (11 pages).

* cited by examiner

100

400

405

Form semiconductor structure

410

Perform etching operation to remove at least portion of contact layer of semiconductor structure

415

Perform etching operation to remove portion of barrier layer and portion of absorber layer

500

Contact Layer 530

Barrier Layer 525

Absorber Layer 520

Contact Layer 515

Buffer Layer 510

Substrate Layer 505

705 — Provide substrate layer

710 — Form buffer layer on substrate layer

715 — Form contact layer on buffer layer

720 — Form absorber layer on contact layer

725 — Form barrier layer on absorber layer

730 — Form contact layer on barrier layer

800

| | |
|---|---|
| Form passivation layer(s) | 805 |

↓

| | |
|---|---|
| Form overglass dielectric layer(s) | 810 |

↓

| | |
|---|---|
| Form vias | 815 |

↓

| | |
|---|---|
| Form grounds | 820 |

↓

| | |
|---|---|
| Form contact material metal | 825 |

↓

| | |
|---|---|
| Form ground metal | 830 |

↓

| | |
|---|---|
| Form metal bumps | 835 |

↓

| | |
|---|---|
| Singulate detector die | 840 |

MULTI-ETCH DETECTOR PIXELS FABRICATION AND ASSOCIATED IMAGING SYSTEMS AND METHODS

CROSS-REFERENCE TO RELATED APPLICATIONS

This patent application is a continuation of International Patent Application No. PCT/US2020/039699 filed Jun. 25, 2020 and entitled "MULTI-ETCH DETECTOR PIXELS FABRICATION AND ASSOCIATED IMAGING SYS-TEMS AND METHODS," which claims priority to and the benefit of U.S. Provisional Patent Application No. 62/867, 188 filed on Jun. 26, 2019 and entitled "MULTI-ETCH DETECTOR PIXELS FABRICATION AND ASSOCI-ATED IMAGING SYSTEMS AND METHODS," all of which are hereby incorporated by reference in their entirety.

TECHNICAL FIELD

One or more embodiments relate generally to semicon-ductor processing associated with imaging systems and more particularly, for example, to multi-etch detector pixels fabrication and associated systems and methods.

BACKGROUND

Imaging systems may include an array of detectors, with each detector functioning as a pixel to produce a portion of a two-dimensional image. There are a wide variety of image detectors, such as visible-light image detectors, infrared image detectors, or other types of image detectors that may be provided in an image detector array for capturing an image. As an example, a plurality of sensors may be pro-vided in an image detector array to detect electromagnetic (EM) radiation at desired wavelengths. In some cases, such as for infrared imaging, readout of image data captured by the detectors may be performed in a time-multiplexed man-ner by a readout integrated circuit (ROIC). The image data that is read out may be communicated to other circuitry, such as for processing, storage, and/or display. In some cases, a combination of a detector array and an ROIC may be referred to as a focal plane array (FPA). Advances in process technology for FPAs and image processing have led to increased capabilities and sophistication of resulting imag-ing systems.

SUMMARY

In one or more embodiments, a method includes forming a semiconductor structure. The semiconductor structure includes a substrate layer, an absorber layer disposed on the substrate layer, a barrier layer disposed on the absorber layer, and a first contact layer disposed on the barrier layer. The method further includes forming the pixels from the semiconductor structure. The forming of the pixels includes performing a first etching operation to remove a portion of at least the first contact layer, and performing a second etching operation to remove a portion of the barrier layer and a portion of the absorber layer. Each of the pixels includes a respective portion of each of the substrate layer, the first contact layer, the barrier layer, and the absorber layer.

In one or more embodiments, an infrared imaging device includes a plurality of pixels. Each of the plurality of pixels includes a respective portion of each of a substrate layer, a contact layer, a barrier layer, and an absorber layer. For each of the plurality of pixels, a recess defined between the respective portion of the contact layer of the pixel and the respective portion of the contact layer of at least one of the pixel's adjacent pixels has a width larger than a recess defined between the respective portion of the absorber layer of the pixel and the respective portion of the absorber layer of the at least one of the pixel's adjacent pixels.

The scope of the present disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 5A through 5C and FIG. 6 illustrate cross-sectional side views as detector pixels are formed in accordance with one or more embodiments of the present disclosure.

Figure 1:
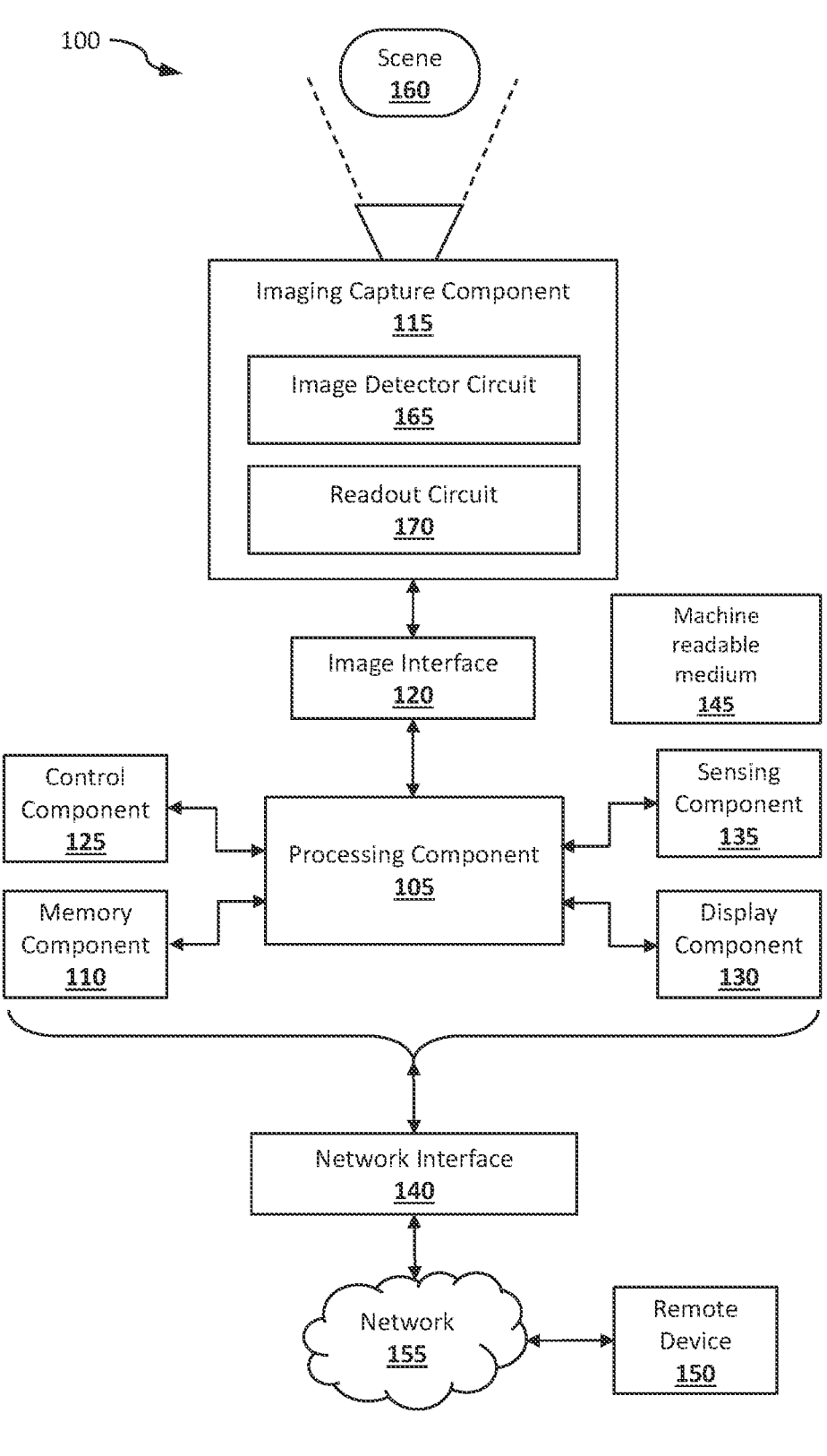
FIG. 1 illustrates a block diagram of an example imaging system in accordance with one or more embodiments of the present disclosure.

Embodiments of the present disclosure and their advan-tages are best understood by referring to the detailed description that follows. It is noted that sizes of various components and distances between these components are not drawn to scale in the figures. It should be appreciated that like reference numerals are used to identify like ele-ments illustrated in one or more of the figures.

DETAILED DESCRIPTION

The detailed description set forth below is intended as a description of various configurations of the subject technol-ogy and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various techniques are provided to facilitate forming of multi-etch detector pixels and associated imaging systems and methods. In some embodiments, an imaging system includes an image detector circuit and a readout circuit. The image detector circuit may include a detector array formed of detector pixels (e.g., also referred to as detector elements or simply pixels). Each detector pixel detects image data associated with components of incident electromagnetic (EM) radiation and generates signals (e.g., electrical signals) indicative of the detected image data. The signals may include photocurrent generated by the detector element in response to incident EM radiation.

Each detector pixel of the detector array may have a stacked detector structure. The stacked detector structures may be implemented using bulk materials (e.g., InP, InGaAs, InAs, InAsSb), superlattice structures such as strain layered superlattices (SLSs), quantum well infrared photo-detectors (QWIPs), and mercury cadmium telluride (HgCdTe or MCT). The stacked detector structures may include two or more materials, such as to form a binary material system, ternary material system, quaternary material system, and so forth. In some aspects, binary, ternary, and quaternary refer to a semiconductor compound having two, three, or four different elements, respectively. As one example, the stacked detector structures may be implemented using bulk materials formed of two or more materials. As another example, the stacked detector structures may be implemented using a superlattice structure, where each layer of the superlattice structure is formed of two or more materials.

The stacked detector structure may include stacked semiconductor layers. In some cases, one or more of the semiconductor layers may be formed through epitaxial growth. Such a layer(s) may be referred to as an EPI layer. In an aspect, the stacked detector structure is a barrier detector structure including a substrate layer, an absorber layer, a barrier layer, and a contact layer. The contact layer, the barrier layer, and the absorber layer may provide an nBn structure, a pBp structure, an nBp structure, or a pBn structure, where "B" denotes the barrier layer. In some cases, the barrier layer may be a n-type barrier layer or a p-type barrier layer. Dopants may be utilized to define a conductivity type (e.g., n-type or p-type) of the layers of the stacked detector structure. In an aspect, the dopants may be provided as part of epitaxial growth or subsequent to epitaxial growth (e.g., a zinc well formed after epitaxial growth). An example p-type dopant is zinc. An example n-type dopant is sulfur. In one example, the substrate layer may be a gallium antimonide (GaSb) substrate layer. In one example, the absorber layer may be an indium gallium arsenide (InAsSb) bulk EPI layer.

The barrier layer may be formed to block majority carriers while not impeding flow of photogenerated carriers (e.g., photogenerated minority carriers). The barrier layer may provide passivation for the absorber layer. The barrier layers may be formed of appropriate material and, in some cases, dopants to minimize (e.g., reduce or eliminate) leakage current, such as generation-recombination current, and/or dark current. In some cases, the barrier layer may be formed of appropriate material and dopants to effectuate a desired bandgap and/or facilitate formation (e.g., epitaxial growth) of n-type layers and/or p-type layers.

In various embodiments, detector pixels of the imaging system may be fabricated by forming the stacked detector structure and performing etching operations on the stacked detector structure. To form the stacked detector structure, the absorber layer may be disposed on the substrate layer, the barrier layer may be disposed on the absorber layer, and the contact layer may be disposed on the barrier layer. In some cases, the stacked detector structure may further include a buffer layer disposed on the substrate layer and a second contact layer disposed on the buffer layer, such that the buffer layer and the second contact layer are between the substrate layer and the absorber layer. One or more of these layers may be epitaxially grown. In such cases, the contact layer disposed on the barrier layer may be referred to as a first contact layer.

The etching operations may be performed to define (e.g., delineate) the pixels of the imaging system. Each etching operation may include a wet etch, a dry etch, or a combination thereof. In this regard, the pixels may be referred to as mesa structures, detector mesas, or variants thereof. A first etching operation may be performed to remove a portion of at least the first contact layer. A second etching operation may be performed to remove a portion of the barrier layer and a portion of the absorber layer. The first etching operation may be performed before or after the second etching operation. In an aspect, a width associated with the second etching operation may be narrower than a width associated with the first etching operation. In some cases, an amount of material removed by the first etching operation may be greater than an amount of material removed by the second etching operation.

As one example, the first etching operation is performed before the second etching operation. In this example, the first etching operation removes a portion of the first contact layer to expose the barrier layer. The first etching operation may be stopped (e.g., performed to a depth) at, in, or below the barrier layer. In this regard, in some cases, the first etching operation may also remove a portion of the barrier layer. The second etching operation removes a portion of the barrier layer and the absorber layer. The second etching operation may be associated with a narrower width than the first etching operation. As another example, the second etching operation is performed before the first etching operation. In this example, the second etching operation removes a portion of the first contact layer, the barrier layer, and the absorber layer. The first etching operation removes a portion of the first contact layer and, in some cases, a portion of the barrier layer. The second etching operation may be associated with a narrower width than the first etching operation. While the foregoing provides embodiments in which two etching operations are performed, in some embodiments more than two etching operations are performed to delineate the pixels.

In some embodiments, the absorber layer may include a superlattice structure and thus may be referred to as a superlattice-based absorber layer. In one example, the superlattice structure is a Type-II superlattice (T2SL) structure. In an aspect, a superlattice structure includes a series of two or more alternating layers of different material and may define, for example, either matched or strained layers. Such layers of the superlattice structure may be referred to as layers or sub-layers. Each layer of the superlattice structure may include two or more elements. By way of non-limiting examples, the T2SL structure may be a binary/binary T2SL, binary/ternary T2SL, binary/quaternary T2SL, ternary/ternary T2SL, ternary/quaternary T2SL, quaternary/quaternary T2SL, or other structure, where binary refers to a semiconductor compound having two different elements and ternary refers to a semiconductor compound having three different elements. As an example, the superlattice-based absorber layer may have a ternary/ternary structure that includes alternating layers of InGaAs and gallium arsenide antimonide (GaAsSb). In this example, each period of the absorber layer includes a layer of InGaAs adjacent to a layer of GaAsSb. Such a superlattice may be referred to as an InGaAs/GaAsSb superlattice. Different periods and/or compositions of material may be utilized to define properties (e.g., bandgap(s)) of the superlattice.

Material system and/or architecture utilized to implement the stacked detector structures are generally application specific. For example, the material system and/or architecture may be configured to have a desired bandgap(s) (e.g., desired combination/arrangement of bandgaps), facilitate extraction of photocarriers, and/or facilitate blocking of majority carriers. For a superlattice, different periods and/or compositions of material may be utilized to define properties (e.g., bandgap(s)) of the superlattice. N-type and p-type layers may be composed of any semiconductor material (e.g., photosensitive semiconductor material) with n-type doping and p-type doping, respectively. The n-type layers and p-type layers may be intentionally doped and/or intrinsically doped. Stacked detector designs (e.g., material composition, dimension of each layer) and associated doping profiles may be selected to facilitate flow of (e.g., unimpeded flow of) photogenerated carriers at contacts of the stacked detector structures.

Utilization of a multi-step etch facilitates delineation of the pixels (e.g., by etching down to or through the barrier layer) and controlling pixel-to-pixel cross-talk, while increasing (e.g., maximizing) an amount of overlap of the barrier layer on the absorber layer. In some aspects, the multi-step etch may allow improved overall material passivation, and/or a reduction in a presence of detector artifacts such as non-uniformity correction (NUC) unstable pixels. For instance, the improved overall material passivation may be achieved through reducing or eliminating an amount of a top surface of a detector (e.g., a detector's absorber layer) that is not passivated. NUC instability may be due to pixels that drift over time and can vary from cooldown to cooldown. An increase in the amount of overlap of the barrier layer on the absorber is indicative of a reduction (e.g., minimization) in an amount of material below the barrier layer, such as an amount of the absorber layer, that is exposed by the etching operations. In some cases, exposing less of the absorber layer facilitates improved device performance. In some embodiments, the multi-step etch may be utilized to facilitate etching (e.g., also referred to as mesa etching) to form the detector mesas and passivation of the detector mesas for detectors (e.g., T2SL nBn detectors) including III-V semiconductors. The multi-etch approach may mitigate NUC instability associated with detectors including III-V semiconductors or other material compositions.

Various embodiments of methods and systems disclosed herein may be included in or implemented as various devices and systems such as visible-light imaging systems, infrared imaging systems, imaging systems having visible-light and infrared imaging capability, mobile digital cameras, video surveillance systems, video processing systems, or other systems or devices that may need to obtain image data in one or multiple portions of the EM spectrum.

Referring now to the drawings, FIG. 1 illustrates a block diagram of an example imaging system 100 (e.g., an infrared camera) in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 may be utilized for capturing and processing images in accordance with an embodiment of the disclosure. The imaging system 100 may represent any type of imaging system that detects one or more ranges (e.g., wavebands) of EM radiation and provides representative data (e.g., one or more still image frames or video image frames). The imaging system 100 may include a housing that at least partially encloses components of the imaging system 100, such as to facilitate compactness and protection of the imaging system 100. For example, the solid box labeled 100 in FIG. 1 may represent the housing of the imaging system 100. The housing may contain more, fewer, and/or different components of the imaging system 100 than those depicted within the solid box in FIG. 1. In an embodiment, the imaging system 100 may include a portable device and may be incorporated, for example, into a vehicle or a non-mobile installation requiring images to be stored and/or displayed. The vehicle may be a land-based vehicle (e.g., automobile), a naval-based vehicle, an aerial vehicle (e.g., unmanned aerial vehicle (UAV)), a space vehicle, or generally any type of vehicle that may incorporate (e.g., installed within, mounted thereon, etc.) the imaging system 100. In another example, the imaging system 100 may be coupled to various types of fixed locations (e.g., a home security mount, a campsite or outdoors mount, or other location) via one or more types of mounts.

The imaging system 100 includes, according to one implementation, a processing component 105, a memory component 110, an image capture component 115, an image interface 120, a control component 125, a display component 130, a sensing component 135, and/or a network interface 140. The processing component 105, according to various embodiments, includes one or more of a processor, a microprocessor, a central processing unit (CPU), a graphics processing unit (GPU), a single-core processor, a multi-core processor, a microcontroller, a programmable logic device (PLD) (e.g., field programmable gate array (FPGA)), an application specific integrated circuit (ASIC), a digital signal processing (DSP) device, or other logic device that may be configured, by hardwiring, executing software instructions, or a combination of both, to perform various operations discussed herein for embodiments of the disclosure. The processing component 105 may be configured to interface and communicate with the various other components (e.g., 110, 115, 120, 125, 130, 135, etc.) of the imaging system 100 to perform such operations. For example, the processing component 105 may be configured to process captured image data received from the imaging capture component 115, store the image data in the memory component 110, and/or retrieve stored image data from the memory component 110. In one aspect, the processing component 105 may be configured to perform various system control operations (e.g., to control communications and operations of various components of the imaging system 100) and other image processing operations (e.g., data conversion, video analytics, etc.).

The memory component 110 includes, in one embodiment, one or more memory devices configured to store data and information, including infrared image data and information. The memory component 110 may include one or more various types of memory devices including volatile and non-volatile memory devices, such as random access memory (RAM), dynamic RAM (DRAM), static RAM (SRAM), non-volatile random-access memory (NVRAM), read-only memory (ROM), programmable read-only memory (PROM), erasable programmable read-only memory (EPROM), electrically-erasable programmable read-only memory (EEPROM), flash memory, hard disk drive, and/or other types of memory. As discussed above, the processing component 105 may be configured to execute software instructions stored in the memory component 110 so as to perform method and process steps and/or operations. The processing component 105 and/or the image interface 120 may be configured to store in the memory component 110 images or digital image data captured by the image capture component 115. The processing component 105 may be configured to store processed still and/or video images in the memory component 110.

In some embodiments, a separate machine-readable medium 145 (e.g., a memory, such as a hard drive, a compact disk, a digital video disk, or a flash memory) may store the software instructions and/or configuration data which can be executed or accessed by a computer (e.g., a logic device or processor-based system) to perform various methods and operations, such as methods and operations associated with processing image data. In one aspect, the machine-readable medium 145 may be portable and/or located separate from the imaging system 100, with the stored software instructions and/or data provided to the imaging system 100 by coupling the machine-readable medium 145 to the imaging system 100 and/or by the imaging system 100 downloading (e.g., via a wired link and/or a wireless link) from the machine-readable medium 145. It should be appreciated that various modules may be integrated in software and/or hardware as part of the processing component 105, with code (e.g., software or configuration data) for the modules stored, for example, in the memory component 110.

The imaging system 100 may represent an imaging device, such as a video and/or still camera, to capture and process images and/or videos of a scene 160. In this regard, the image capture component 115 of the imaging system 100 may be configured to capture images (e.g., still and/or video images) of the scene 160 in a particular spectrum or modality. The image capture component 115 includes an image detector circuit 165 (e.g., a thermal infrared detector circuit) and a readout circuit 170 (e.g., an ROIC). For example, the image capture component 115 may include an IR imaging sensor (e.g., IR imaging sensor array) configured to detect IR radiation in the near, middle, and/or far IR spectrum and provide IR images (e.g., IR image data or signal) representative of the IR radiation from the scene 160. For example, the image detector circuit 165 may capture (e.g., detect, sense) IR radiation with wavelengths in the range from around 700 nm to around 2 mm, or portion thereof. For example, in some aspects, the image detector circuit 165 may be sensitive to (e.g., better detect) short-wave IR (SWIR) radiation, mid-wave IR (MWIR) radiation (e.g., EM radiation with wavelength of 2-5 μm), and/or long-wave IR (LWIR) radiation (e.g., EM radiation with wavelength of 7-14 μm), or any desired IR wavelengths (e.g., generally in the 0.7 to 14 μm range). In other aspects, the image detector circuit 165 may capture radiation from one or more other wavebands of the EM spectrum, such as visible-light, ultra-violet light, and so forth.

The image detector circuit 165 may capture image data associated with the scene 160. To capture the image, the image detector circuit 165 may detect image data of the scene 160 (e.g., in the form of EM radiation) and generate pixel values of the image based on the scene 160. An image may be referred to as a frame or an image frame. In some cases, the image detector circuit 165 may include an array of detectors (e.g., also referred to as an array of pixels) that can detect radiation of a certain waveband, convert the detected radiation into electrical signals (e.g., voltages, currents, etc.), and generate the pixel values based on the electrical signals. Each detector in the array may capture a respective portion of the image data and generate a pixel value based on the respective portion captured by the detector. The pixel value generated by the detector may be referred to as an output of the detector. By way of non-limiting examples, each detector may be a photodetector, such as an avalanche photodiode, an infrared photodetector, a quantum well infra-red photodetector, a microbolometer, or other detector capable of converting EM radiation (e.g., of a certain wavelength) to a pixel value. The array of detectors may be arranged in rows and columns. In one or more embodiments, the image detector circuit 165 may include stacked detector structures, such as barrier detector structures. The image detector circuit 165 may include a substrate layer, an absorber layer, a barrier layer, and a contact layer. The absorber layer may include a superlattice structure.

The image may be, or may be considered, a data structure that includes pixels and is a representation of the image data associated with the scene 160, with each pixel having a pixel value that represents EM radiation emitted or reflected from a portion of the scene and received by a detector that generates the pixel value. Based on context, a pixel may refer to a detector of the image detector circuit 165 that generates an associated pixel value or a pixel (e.g., pixel location, pixel coordinate) of the image formed from the generated pixel values.

In an aspect, the pixel values generated by the image detector circuit 165 may be represented in terms of digital count values generated based on the electrical signals obtained from converting the detected radiation. For example, in a case that the image detector circuit 165 includes or is otherwise coupled to an analog-to-digital converter (ADC) circuit, the ADC circuit may generate digital count values based on the electrical signals. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 165 (e.g., an IR image detector circuit) is associated with higher digital count values and higher temperatures.

The readout circuit 170 may be utilized as an interface between the image detector circuit 165 that detects the image data and the processing component 105 that processes the detected image data as read out by the readout circuit 170, with communication of data from the readout circuit 170 to the processing component 105 facilitated by the image interface 120. An image capturing frame rate may refer to the rate (e.g., images per second) at which images are detected in a sequence by the image detector circuit 165 and provided to the processing component 105 by the readout circuit 170. The readout circuit 170 may read out the pixel values generated by the image detector circuit 165 in accordance with an integration time (e.g., also referred to as an integration period).

In various embodiments, a combination of the image detector circuit 165 and the readout circuit 170 may be, may include, or may together provide an FPA. In some aspects, the image detector circuit 165 may be a thermal image detector circuit that includes an array of microbolometers, and the combination of the image detector circuit 165 and the readout circuit 170 may be referred to as a microbolometer FPA. In some cases, the array of microbolometers may be arranged in rows and columns. The microbolometers may detect IR radiation and generate pixel values based on the detected IR radiation. For example, in some cases, the microbolometers may be thermal IR detectors that detect IR radiation in the form of heat energy and generate pixel values based on the amount of heat energy detected. The microbolometer FPA may include IR detecting materials such as amorphous silicon (a-Si), vanadium oxide ($VO_x$), a combination thereof, and/or other detecting material(s). In an aspect, for a microbolometer FPA, the integration time may be, or may be indicative of, a time interval during which the microbolometers are biased. In this case, a longer integration time may be associated with higher gain of the IR signal, but not more IR radiation being collected. The IR radiation may be collected in the form of heat energy by the microbolometers.

In some cases, the imaging capture component 115 may include one or more filters adapted to pass radiation of some wavelengths but substantially block radiation of other wavelengths. For example, the imaging capture component 115 may be an IR imaging device that includes one or more filters adapted to pass IR radiation of some wavelengths while substantially blocking IR radiation of other wavelengths (e.g., MWIR filters, thermal IR filters, and narrow-band filters). In this example, such filters may be utilized to tailor the imaging capture component 115 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

In one specific, not-limiting example, the image capture component 115 may comprise an IR imaging sensor having an FPA of detectors responsive to IR radiation including near infrared (NIR), short-wave IR (SWIR), MWIR, long-wave IR (LWIR), and/or very-long wave IR (VLWIR) radiation. In some other embodiments, alternatively or in addition, the image capture component 115 may include a complementary metal oxide semiconductor (CMOS) sensor or a charge-coupled device (CCD) sensor that can be found in any consumer camera (e.g., visible light camera).

Other imaging sensors that may be embodied in the image capture component 115 include a photonic mixer device (PMD) imaging sensor or other time of flight (ToF) imaging sensor, light detection and ranging (LIDAR) imaging device, millimeter imaging device, positron emission tomography (PET) scanner, single photon emission computed tomography (SPECT) scanner, ultrasonic imaging device, or other imaging devices operating in particular modalities and/or spectra. It is noted that for some of these imaging sensors that are configured to capture images in particular modalities and/or spectra (e.g., infrared spectrum, etc.), they are more prone to produce images with low frequency shading, for example, when compared with a typical CMOS-based or CCD-based imaging sensors or other imaging sensors, imaging scanners, or imaging devices of different modalities.

The images, or the digital image data corresponding to the images, provided by the image capture component 115 may be associated with respective image dimensions (also referred to as pixel dimensions). An image dimension, or pixel dimension, generally refers to the number of pixels in an image, which may be expressed, for example, in width multiplied by height for two-dimensional images or otherwise appropriate for relevant dimension or shape of the image. Thus, images having a native resolution may be resized to a smaller size (e.g., having smaller pixel dimensions) in order to, for example, reduce the cost of processing and analyzing the images. Filters (e.g., a non-uniformity estimate) may be generated based on an analysis of the resized images. The filters may then be resized to the native resolution and dimensions of the images, before being applied to the images.

The image interface 120 may include, in some embodiments, appropriate input ports, connectors, switches, and/or circuitry configured to interface with external devices (e.g., a remote device 150 and/or other devices) to receive images (e.g., digital image data) generated by or otherwise stored at the external devices. The received images or image data may be provided to the processing component 105. In this regard, the received images or image data may be converted into signals or data suitable for processing by the processing component 105. For example, in one embodiment, the image interface 120 may be configured to receive analog video data and convert it into suitable digital data to be provided to the processing component 105.

In some embodiments, the image interface 120 may include various standard video ports, which may be connected to a video player, a video camera, or other devices capable of generating standard video signals, and may convert the received video signals into digital video/image data suitable for processing by the processing component 105. In some embodiments, the image interface 120 may also be configured to interface with and receive images (e.g., image data) from the image capture component 115. In other embodiments, the image capture component 115 may interface directly with the processing component 105.

The control component 125 includes, in one embodiment, a user input and/or an interface device, such as a rotatable knob (e.g., potentiometer), push buttons, slide bar, keyboard, and/or other devices, that is adapted to generate a user input control signal. The processing component 105 may be configured to sense control input signals from a user via the control component 125 and respond to any sensed control input signals received therefrom. The processing component 105 may be configured to interpret such a control input signal as a value, as generally understood by one skilled in the art. In one embodiment, the control component 125 may include a control unit (e.g., a wired or wireless handheld control unit) having push buttons adapted to interface with a user and receive user input control values. In one implementation, the push buttons of the control unit may be used to control various functions of the imaging system 100, such as autofocus, menu enable and selection, field of view, brightness, contrast, noise filtering, image enhancement, and/or various other features of an imaging system or camera.

The display component 130 includes, in one embodiment, an image display device (e.g., a liquid crystal display (LCD)) or various other types of generally known video displays or monitors. The processing component 105 may be configured to display image data and information on the display component 130. The processing component 105 may be configured to retrieve image data and information from the memory component 110 and display any retrieved image data and information on the display component 130. The display component 130 may include display circuitry, which may be utilized by the processing component 105 to display image data and information. The display component 130 may be adapted to receive image data and information directly from the image capture component 115, processing component 105, and/or image interface 120, or the image data and information may be transferred from the memory component 110 via the processing component 105.

The sensing component 135 includes, in one embodiment, one or more sensors of various types, depending on the application or implementation requirements, as would be understood by one skilled in the art. Sensors of the sensing component 135 provide data and/or information to at least the processing component 105. In one aspect, the processing component 105 may be configured to communicate with the sensing component 135. In various implementations, the sensing component 135 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder or time-of-flight camera), and/or whether a tunnel or other type of enclosure has been entered or exited. The sensing component 135 may represent conventional sensors as generally known by one skilled in the art for monitoring various conditions (e.g., environmental conditions) that may have an effect (e.g., on the image appearance) on the image data provided by the image capture component 115.

In some implementations, the sensing component 135 (e.g., one or more sensors) may include devices that relay information to the processing component 105 via wired and/or wireless communication. For example, the sensing component 135 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques. In some embodiments, the processing component 105 can use the information (e.g., sensing data) retrieved from the sensing component 135 to modify a configuration of the image capture component 115 (e.g., adjusting a light sensitivity level, adjusting a direction or angle of the image capture component 115, adjusting an aperture, etc.).

In some embodiments, various components of the imaging system 100 may be distributed and in communication with one another over a network 155. In this regard, the imaging system 100 may include a network interface 140 configured to facilitate wired and/or wireless communication among various components of the imaging system 100 over the network 155. In such embodiments, components may also be replicated if desired for particular applications of the imaging system 100. That is, components configured for same or similar operations may be distributed over a network. Further, all or part of any one of the various components may be implemented using appropriate components of the remote device 150 (e.g., a conventional digital video recorder (DVR), a computer configured for image processing, and/or other device) in communication with various components of the imaging system 100 via the network interface 140 over the network 155, if desired. Thus, for example, all or part of the processing component

105, all or part of the memory component 110, and/or all of part of the display component 130 may be implemented or replicated at the remote device 150. In some embodiments, the imaging system 100 may not include imaging sensors (e.g., image capture component 115), but instead receive images or image data from imaging sensors located separately and remotely from the processing component 105 and/or other components of the imaging system 100. It will be appreciated that many other combinations of distributed implementations of the imaging system 100 are possible, without departing from the scope and spirit of the disclosure.

Furthermore, in various embodiments, various components of the imaging system 100 may be combined and/or implemented or not, as desired or depending on the application or requirements. In one example, the processing component 105 may be combined with the memory component 110, image capture component 115, image interface 120, display component 130, sensing component 135, and/or network interface 140. In another example, the processing component 105 may be combined with the image capture component 115, such that certain functions of processing component 105 are performed by circuitry (e.g., a processor, a microprocessor, a logic device, a microcontroller, etc.) within the image capture component 115.

Figure 2:
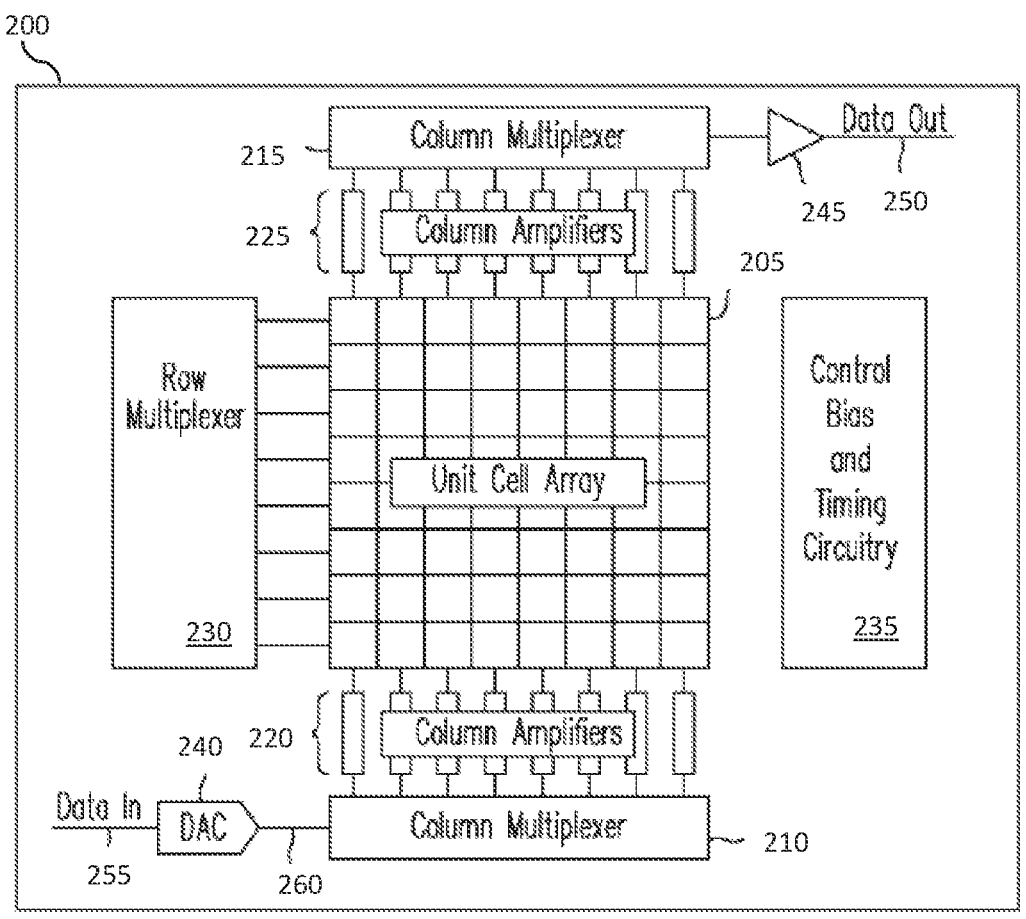
FIG. 2 illustrates a block diagram of an example image sensor assembly in accordance with one or more embodi-ments of the present disclosure.

FIG. 2 illustrates a block diagram of an example image sensor assembly 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 200 may be an FPA, for example, implemented as the imaging capture component 115 of FIG. 1.

The image sensor assembly 200 includes a unit cell array 205, column multiplexers 210 and 215, column amplifiers 220 and 225, a row multiplexer 230, control bias and timing circuitry 235, a digital-to-analog converter (DAC) 240, and a data output buffer 245. The unit cell array 205 includes an array of unit cells. In an aspect, each unit cell may include a detector (e.g., a pixel) and interface circuitry. The interface circuitry of each unit cell may provide an output signal, such as an output voltage or an output current, in response to a detector signal (e.g., detector current, detector voltage) provided by the detector of the unit cell. The output signal may be indicative of the magnitude of EM radiation received by the detector. The column multiplexer 215, column amplifiers 220, row multiplexer 230, and data output buffer 245 may be used to provide the output signals from the unit cell array 205 as a data output signal on a data output line 250. The output signals on the data output line 250 may be provided to components downstream of the image sensor assembly 200, such as processing circuitry (e.g., the processing component 105 of FIG. 1), memory (e.g., the memory component 110 of FIG. 1), display device (e.g., the display component 130 of FIG. 1), and/or other component to facilitate processing, storage, and/or display of the output signals. The data output signal may be an image formed of the pixel values for the image sensor assembly 200. In this regard, the column multiplexer 215, the column amplifiers 220, the row multiplexer 230, and the data output buffer 245 may collectively provide an ROIC (or portion thereof) of the image sensor assembly 200. In an embodiment, components of the image sensor assembly 200 may be implemented such that the unit cell array 205 is hybridized to (e.g., bonded to, joined to, mated to) the ROIC.

The column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array 205 traverses to get to the column multiplexer 215. As another example, the column amplifiers 225 may include an ADC for converting analog signals to digital signals (e.g., to obtain digital count values). These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., IR light) incident on the detectors of the unit cells.

In an aspect, the control bias and timing circuitry 235 may generate bias values, timing control voltages, and switch control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. In another aspect, the control bias and timing circuitry 235 may generate the bias signals (e.g., analog signals) and provide the bias signals to the unit cells without utilizing the DAC 240. In this regard, some implementations do not include the DAC 240, data input signal line 255, and/or analog signal line(s) 260. In an embodiment, the control bias and timing circuitry 235 may be, may include, may be a part of, or may otherwise be coupled to the processing component 105 and/or imaging capture component 115 of FIG. 1.

In an embodiment, the image sensor assembly 200 may be implemented as part of an imaging system (e.g., 100). In addition to the various components of the image sensor assembly 200, the imaging system may also include one or more processors, memories, logic, displays, interfaces, optics (e.g., lenses, mirrors, beamsplitters), and/or other components as may be appropriate in various implementations. In an aspect, the data output signal on the data output line 250 may be provided to the processors (not shown) for further processing. For example, the data output signal may be an image formed of the pixel values from the unit cells of the image sensor assembly 200. The processors may perform operations such as non-uniformity correction (NUC), spatial and/or temporal filtering, and/or other operations. The images (e.g., processed images) may be stored in memory (e.g., external to or local to the imaging system) and/or displayed on a display device (e.g., external to and/or integrated with the imaging system).

By way of non-limiting examples, the unit cell array 205 may include 512×512 (e.g., 512 rows and 512 columns of unit cells), 1024×1024, 2048×2048, 4096×4096, 8192× 8192, and/or other array sizes. In some cases, the array size may have a row size (e.g., number of detectors in a row) different from a column size (e.g., number of detectors in a column). Examples of frame rates may include 30 Hz, 60 Hz, and 120 Hz. In an aspect, each unit cell of the unit cell array 205 may represent a pixel.

Figure 3:
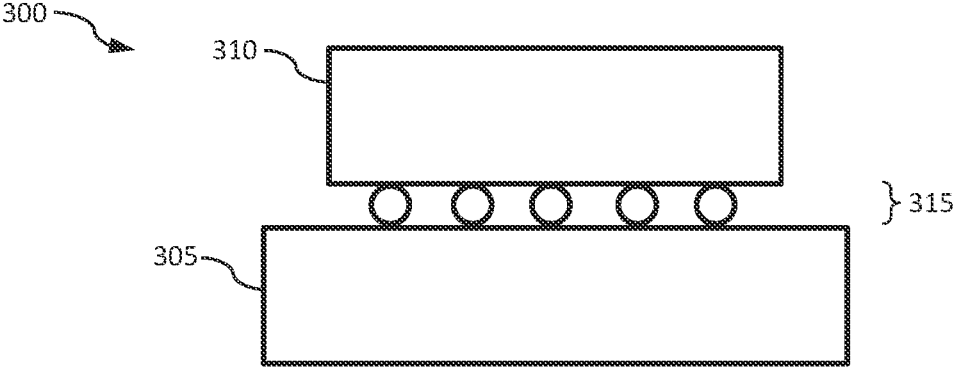
FIG. 3 illustrates an example image sensor assembly in accordance with one or more embodiments of the present disclosure.

In an embodiment, components of the image sensor assembly 200 may be implemented such that a detector array is hybridized to (e.g., bonded to) a readout circuit. For example, FIG. 3 illustrates an example image sensor assembly 300 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 300 may be, may include, or may be a part of the image sensor assembly 200.

The image sensor assembly 300 includes a device wafer 305, a readout circuit 310, and contacts 315 to bond (e.g., mechanically and electrically bond) the device wafer 305 to the readout circuit 310. The device wafer 305 may include detectors (e.g., the unit cell array 205). The contacts 315 may bond the detectors of the device wafer 305 and the readout circuit 310. The contacts 315 may include conductive contacts of the detectors of the device wafer 305, conductive contacts of the readout circuit 310, and/or metallic bonds between the conductive contacts of the detectors and the conductive contacts of the readout circuit 310. In one embodiment, the device wafer 305 may be bump-bonded to the readout circuit 310 using bonding bumps (e.g., indium bumps). The bonding bumps may be formed on the device wafer 305 and/or the readout circuit 310 to allow connection between the device wafer 305 and the readout circuit 310. In an aspect, hybridizing the device wafer 305 to the readout circuit 310 may refer to bonding the device wafer 305 (e.g., the detectors of the device wafer 305) to the readout circuit 310 to mechanically and electrically bond the device wafer 305 and the readout circuit 310.

Figure 4:
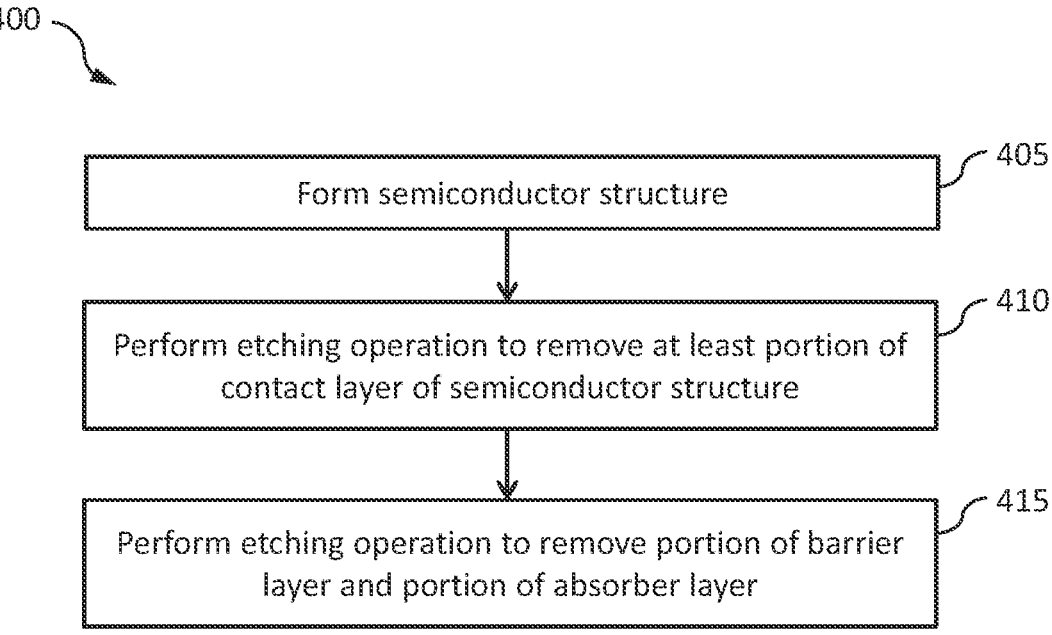
FIG. 4 illustrates a flow diagram of an example process for facilitating multi-etch detector pixels fabrication in accordance with one or more embodiments of the present disclosure.

FIG. 4 illustrates a flow diagram of an example process 400 for facilitating multi-etch detector pixels fabrication in accordance with one or more embodiments of the present disclosure. Note that one or more operations in FIG. 4 may be combined, omitted, and/or performed in a different order as desired. In a first example, pixels of a detector circuit of an imaging system can be formed from a semiconductor structure 500 in accordance with one or more embodiments of the present disclosure according to the cross-sectional side views illustrated in (in order) FIGS. 5A through 5C.

Figure 5A:
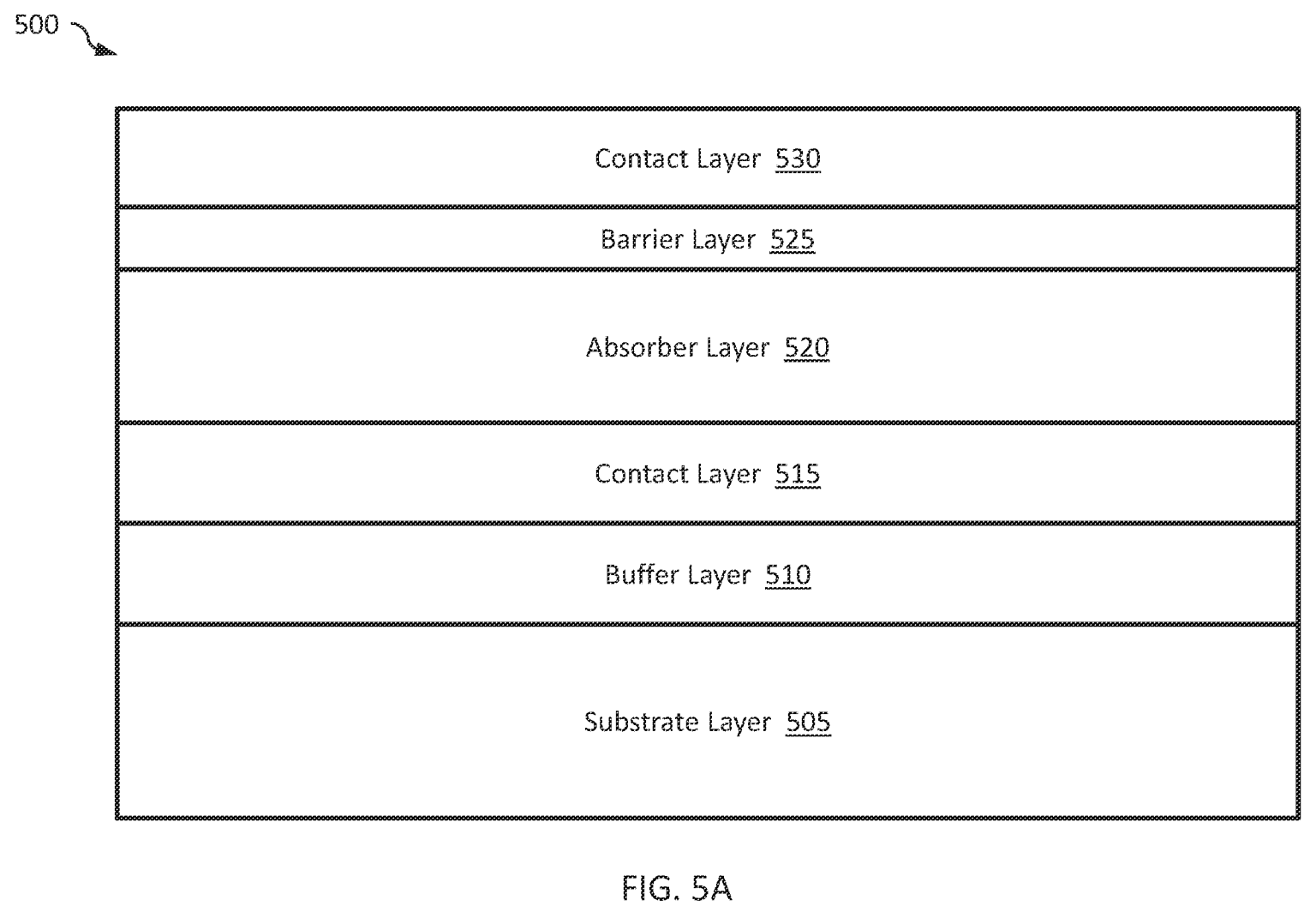

In the first example, at block 405, as shown in FIG. 5A, the semiconductor structure 500, from which pixels are to be delineated, is formed. The semiconductor structure 500 includes a substrate layer 505, a buffer layer 510, a contact layer 515 (e.g., a lower/bottom contact layer), an absorber layer 520, a barrier layer 525, and a contact layer 530 (e.g., an upper/top contact layer, a cap contact layer, or a cap layer). An example process to form the semiconductor structure 500 is described with respect to FIG. 7. The substrate layer 505 provides an appropriate material on which subsequent layers of material may be epitaxially grown. In one example, the substrate layer 505 is a GaSb substrate layer. The absorber layer 520 is disposed on (e.g., epitaxially grown on) the contact layer 515. In one aspect, the absorber layer 520 may have a superlattice structure (e.g., T2SL structure). The barrier layer 525 is disposed on (e.g., epitaxially grown on) the absorber layer 520. The contact layer 530 is disposed on (e.g., epitaxially grown on) the barrier layer 525.

The contact layer 530, the barrier layer 525, and the absorber layer 520 may provide an nBn structure, a pBp structure, an nBp structure, or a pBn structure, where "B" denotes the barrier layer 525. In some cases, the barrier layer 525 may be a n-type barrier layer or a p-type barrier layer. Dopants may be utilized to define a conductivity type (e.g., n-type or p-type) of the layers (e.g., 530, 525, 520) of the semiconductor structure 500. N-type layers and p-type layers may be intentionally doped and/or intrinsically doped. In an aspect, the dopants may be provided as part of epitaxial growth or subsequent to epitaxial growth (e.g., a zinc well formed after epitaxial growth). An example p-type dopant is zinc. An example n-type dopant is sulfur. It is noted that in some cases the buffer layer 510 and/or the contact layer 530 may be optional. In such cases, the absorber layer 520 is in contact with the substrate layer 505, and the substrate layer 505 provides an appropriate material on which the absorber layer 520 may be epitaxially grown.

Figure 5B:
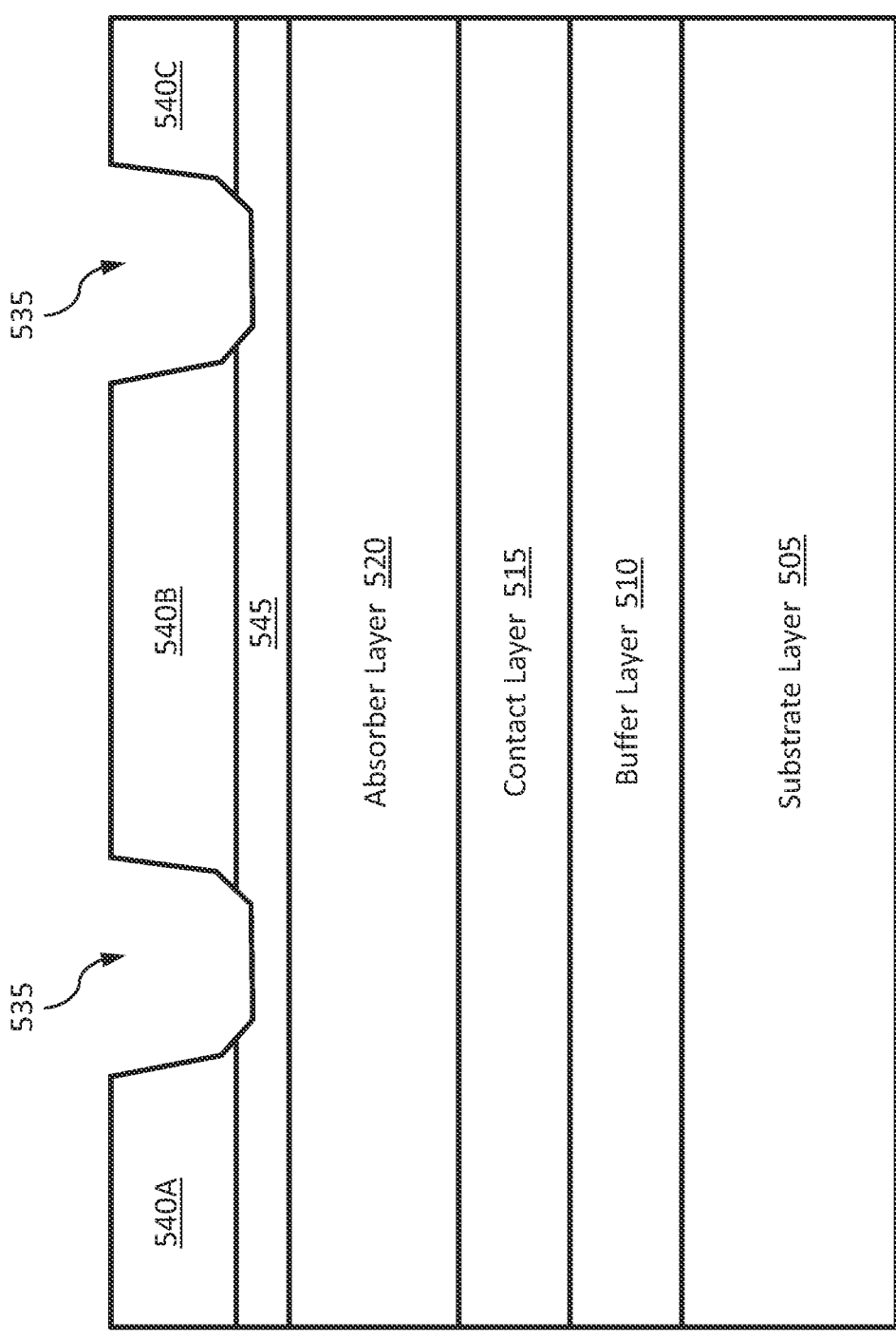

At block 410, an etching operation is performed on the semiconductor structure 500 to remove at least a portion of the contact layer 530. In FIG. 5B, the etching operation etches into the barrier layer 525 to remove a portion of the barrier layer 525, although in other cases the etching operation may etch to a depth at a top surface of the barrier layer 525 to leave the top surface of the barrier layer 525 exposed but not etched. As shown in FIG. 5B, removal of the portion of the contact layer 530 and the barrier layer 525 forms gaps 535 that extend through an entire thickness of the contact layer 530 and into the barrier layer 525. Gaps may also be referred to as openings, cavities, holes, vias, or recesses. The removal leaves behind etched portions 540A-C of the contact layer 530 and an etched portion 545 of the barrier layer 525. In an aspect, the portions 540A-C of the contact layer 530 are discontinuous (e.g., disjoint) from each other.

Figure 5C:
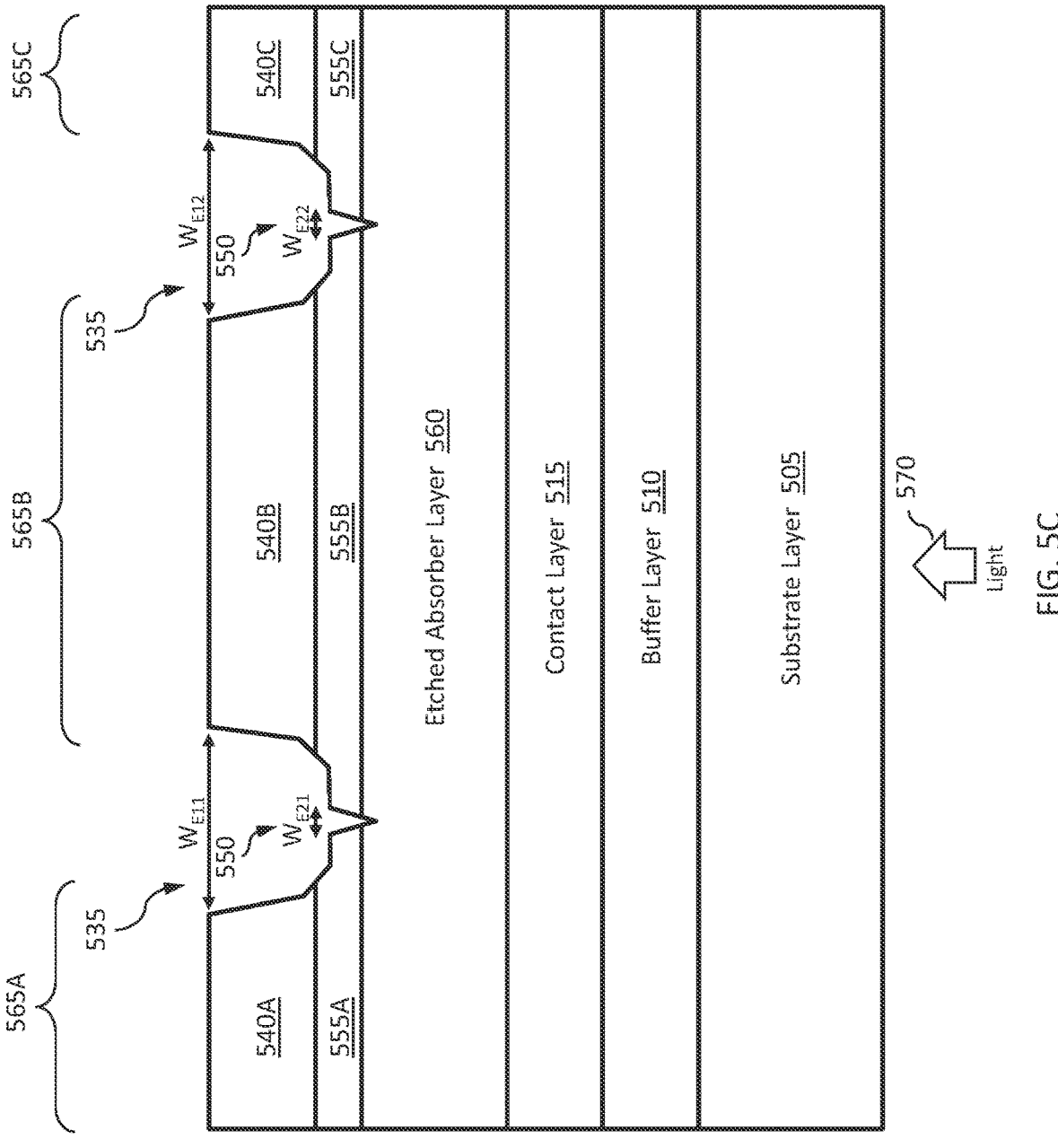

At block 415, as shown in FIG. 5C, an etching operation is performed on the structure of FIG. 5B to remove a portion of the etched portion 545 of the barrier layer 525 and a portion of the absorber layer 520 to delineate (e.g., define) pixels 565A-C of the imaging system (e.g., a detector array of the imaging system). The pixels 565A-C each has a stacked detector structure (e.g., a detector mesa). It is noted that the pixels 565A-C depicted in FIG. 5C may represent a portion of each of the pixels 565A-C and not an entirety of the pixels 565A-C. Removal of the portion of the etched portion 545 and the absorber layer 520 forms gaps 540 that extend through the etched portion 545 of the barrier layer 525 and into the absorber layer 520. The removal leaves behind etched portions 555A-C of the barrier layer 525 and an etched absorber layer 560. In an aspect, the portions 555A-C of the barrier layer 525 are discontinuous (e.g., disjoint) from each other.

As such, each of the pixels 565A-C includes a respective portion of each of the contact layer 530, the barrier layer 525, and the absorber layer 520. In this regard, the pixel 565A includes the etched portion 540A of the contact layer 530, the etched portion 555A of the barrier layer 525, and a portion of the etched absorber layer 560; the pixel 565B includes the etched portion 540B of the contact layer 530, the etched portion 555B of the barrier layer 525, and a portion of the etched absorber layer 560; and the pixel 565C includes the etched portion 540C of the contact layer 530, the etched portion 555C of the barrier layer 525, and a portion of the etched absorber layer 560. It is noted that nominally the etching operation performed at block 415 does not etch the etched portions 540A-C of the contact layer 530, in some cases portions (e.g., small portions) of one or more of the etched portions 540A-C may be removed by the etching operation performed at block 415.

In an embodiment, the etching operations performed at each of block 410 and 415 includes a wet etch operation, a dry etch operation, a combination thereof, or other appropriate etching operation to remove a desired material. In an aspect, to facilitate an etching operation, appropriate material(s) (e.g., hardmask and/or photoresist) (not shown in FIGS. 5B and 5C) may be deposited as appropriate and patterned using semiconductor fabrication techniques to define portions of material to be removed (or, equivalently, define portions to be left intact) by the etching operation. The etching operation may then be performed to obtain a structure according to the patterned material(s). The patterned material(s) may be removed as part of the etching operation or after the etching operation is complete.

As an example, prior to block 410, appropriate material(s) (e.g., hardmask and/or photoresist) may be deposited on the contact layer 530 and patterned using semiconductor fabrication techniques to define portions of the contact layer 530 and the barrier layer 525 to be removed by the etching operation. The etching operation may then be performed (as part of block 410) to obtain the structure of FIG. 5B according to the patterned material(s). The patterned material(s) may be removed as part of the etching operation or after the etching operation is complete.

Figure 6:
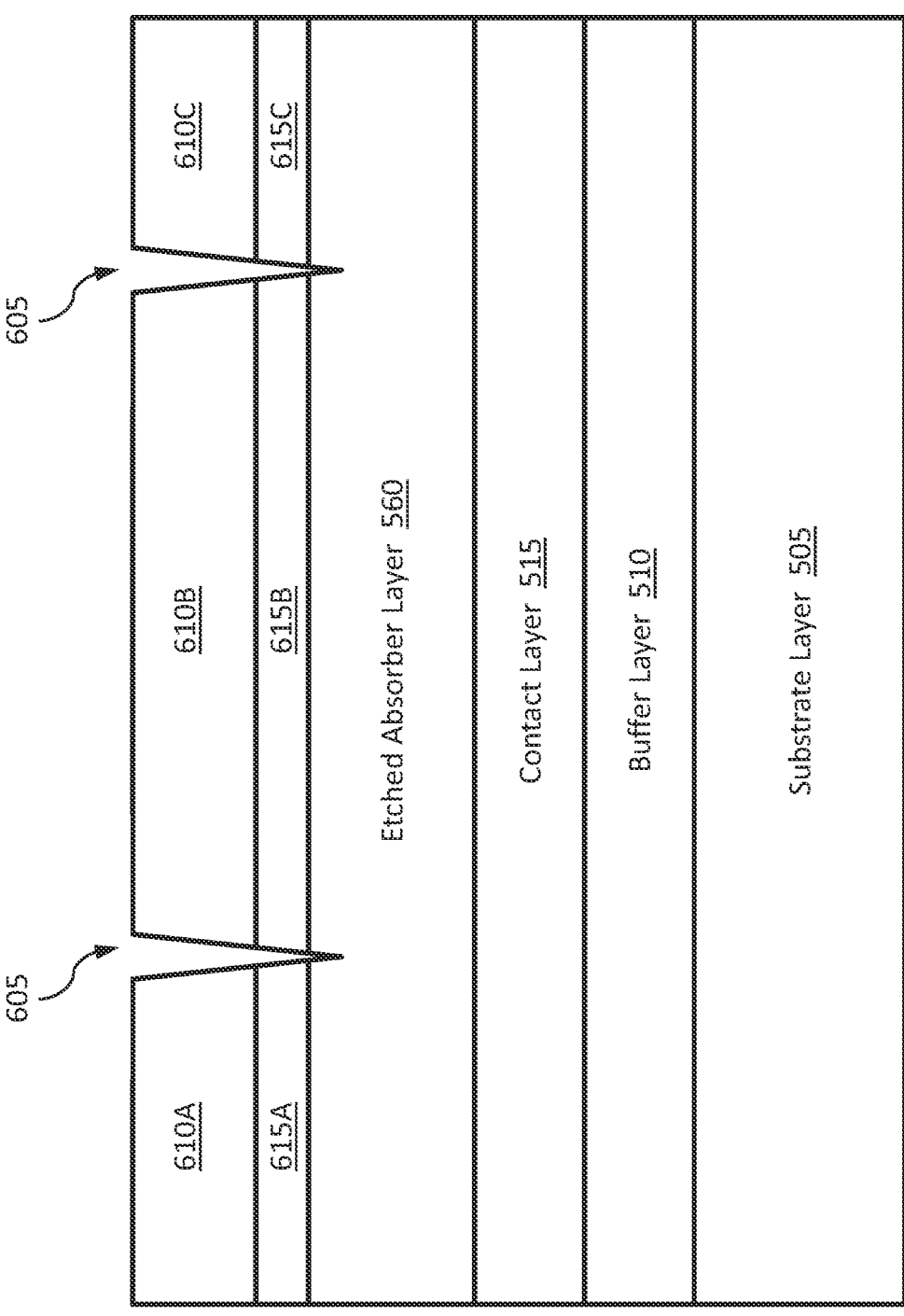

In a second example, the pixels 565A-C of the imaging system can be formed from the semiconductor structure 500 in accordance with one or more embodiments of the present disclosure according to the cross-sectional side views illustrated in (in order) FIGS. 5A, 6, and 5C. The foregoing description pertaining to the first example generally applies to the second example, with examples of differences and other description provided herein.

In the second example, at block 405, as shown in FIG. 5A, the semiconductor structure 500 from which detector pixels are to be delineated is formed. The process 400 then proceeds to block 415. At block 415, an etching operation is performed on the semiconductor structure 500 to remove a portion of each of the contact layer 530, the barrier layer 525, and the absorber layer 520. By performing block 410, the semiconductor structure 500 is etched to form the structure of FIG. 6. Removal of the portion of the contact layer 530, the barrier layer 525, and the absorber layer 520 forms gaps 605 that extend through an entire thickness of the contact layer 530 and the barrier layer 525 and into the absorber layer 520. The removal leaves behind etched portions 610A-C of the contact layer 530, etched portions 615A-C of the barrier layer 525, and the etched absorber layer 560. In an aspect, the portions 610A-C of the contact layer 530 are discontinuous (e.g., disjoint) from each other, and the portions 615A-C of the barrier layer 525 are discontinuous (e.g., disjoint) from each other. The process 400 then proceeds to block 410. At block 410, an etching operation is performed on the structure of FIG. 6 to remove the remaining portion of the contact layer 530 and the barrier layer 525 to form the structure of FIG. 5C. After performing blocks 415 and 410, the pixels 565A-C can be referred to as being delineated. In some cases, the pixels 565A-C may be further processed, such as provided with additional passivation and/or contacts to facilitate connection to a readout circuit.

The etching operation performed at block 410 may be considered a larger width relative to the etching operation performed at block 415. With reference to FIG. 5C, widths $W_{E11}$ and $W_{E12}$ identify widths of the gaps 535 at a largest part of the gaps 535, and widths $W_{E21}$ and $W_{E22}$ identify widths of the gaps 550 at a largest part of the gaps 550. More generally, a width of the gaps 535 may refer to an average width of the gaps 535, a width at a largest part of the gaps, or generally any sidewall to sidewall distance (left-to-right distance in FIG. 5C) (e.g., from sidewall of the etched portion 540A to sidewall of the etched portion 540B, or from sidewall of the etched portion 555A to sidewall of the etched portion 555B). It is noted that $W_{E11}$ may be, but need not be, nominally the same as $W_{E12}$, and similarly $W_{E21}$ may be, but need not be, nominally the same as $W_{E22}$. In some cases, an amount of material removed by the etching operation performed at block 410 is larger than an amount of material removed by the etching operation performed at block 415.

Utilization of a multi-step etch (e.g., by performing blocks 410 and 415) facilitates delineation of the pixels 565A-C (e.g., by etching down to or through the barrier layer 525) and controlling pixel-to-pixel cross-talk, while increasing (e.g., maximizing) an amount of overlap of the barrier layer (e.g., the etched portions 555A-C of the barrier layer 525) on the absorber layer (e.g., the etched absorber layer 560). In some aspects, the multi-step etch may allow improve overall material passivation, and/or a reduction in a presence of detector artifacts such as NUC unstable pixels. For instance, the improved overall material passivation may be achieved through reducing or eliminating an amount of a top surface of a detector (e.g., a top surface of the etched absorber layer 560) that is not passivated by the barrier layer (e.g., the etched portions 555A-C of the barrier layer 525). An increase in the amount of overlap of the barrier layer on the absorber layer is indicative of a reduction (e.g., minimization) in an amount of material below the portions 555A-C of the barrier layer 525, such as an amount of the etched absorber layer 560, that is exposed by the etching operations. In some cases, exposing less of the etched absorber layer 560 facilitates improved device performance. In some embodiments, the multi-step etch may be utilized to facilitate etching to form the detector mesas and passivation of the detector mesas for detectors (e.g., T2SL nBn detectors) including III-V semiconductors. The multi-etch approach may mitigate NUC instability associated with detectors including III-V semiconductors or other material compositions. While the foregoing provides embodiments in which two etching operations are performed, in some embodiments more than two etching operations are performed to delineate the pixels.

Figure 7:
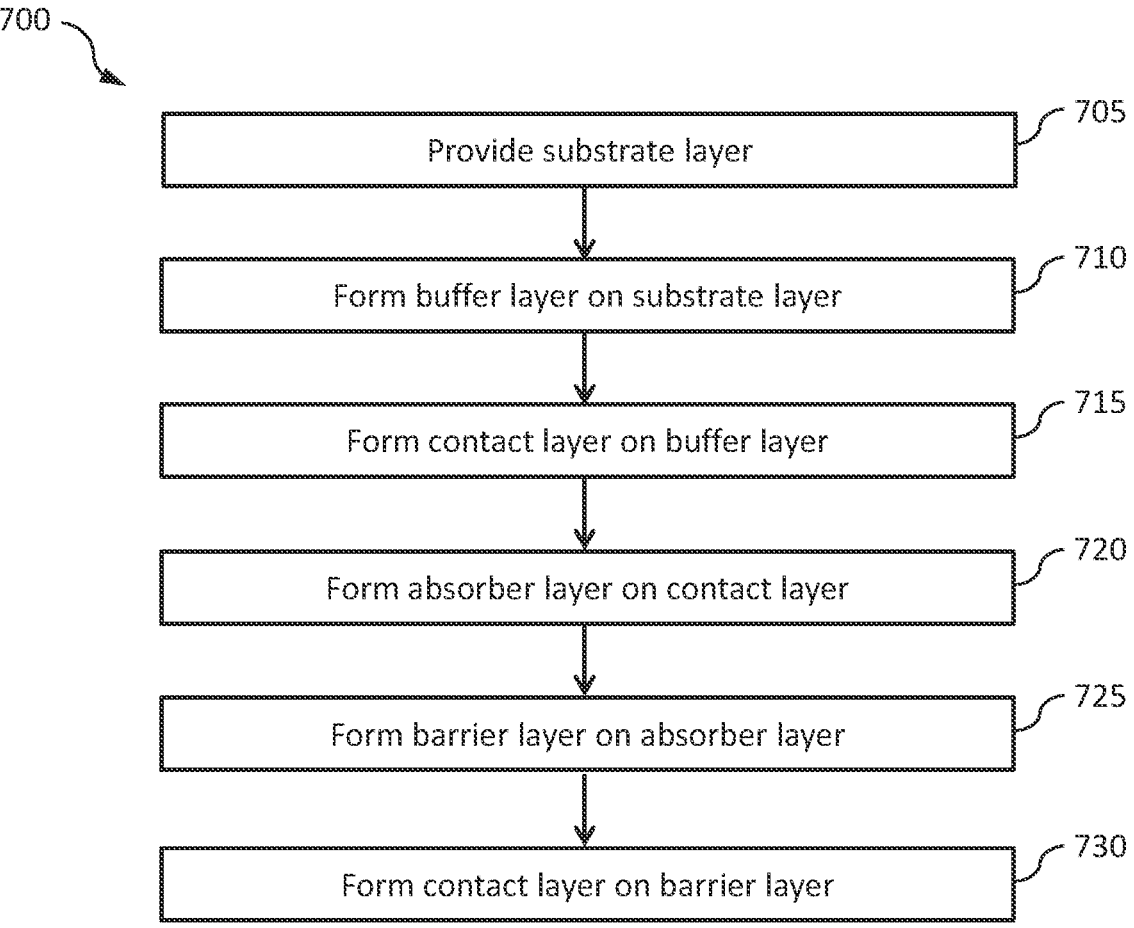
FIG. 7 illustrates a flow diagram of an example process for forming a semiconductor structure in accordance with one or more embodiments of the present disclosure.

FIG. 7 illustrates a flow diagram of an example process 700 for forming a semiconductor structure in accordance with one or more embodiments of the present disclosure. The semiconductor structure may be utilized to form pixels. For explanatory purposes, the process 700 is primarily described herein with reference to the semiconductor structure 500 of FIG. 5A. However, the process 700 can be performed in relation to other semiconductor structures. Note that one or more operations in FIG. 5 may be combined and/or omitted as desired. For example, in some cases, the buffer layer 510 and/or the contact layer 515 may be omitted.

At block 705, the substrate layer 505 is provided. At block 710, the buffer layer 510 is formed on (e.g., epitaxially grown on) the substrate layer 505. At block 715, the contact layer 515 is formed on (e.g., epitaxially grown on) the buffer layer 510. At block 720, the absorber layer 520 is formed on (e.g., epitaxially grown on) the contact layer 515. At block 725, the barrier layer 525 is formed on (e.g., epitaxially grown on) the absorber layer 520. At block 730, the contact layer 530 is formed on (e.g., epitaxially grown on) the barrier layer 525.

Figure 8:
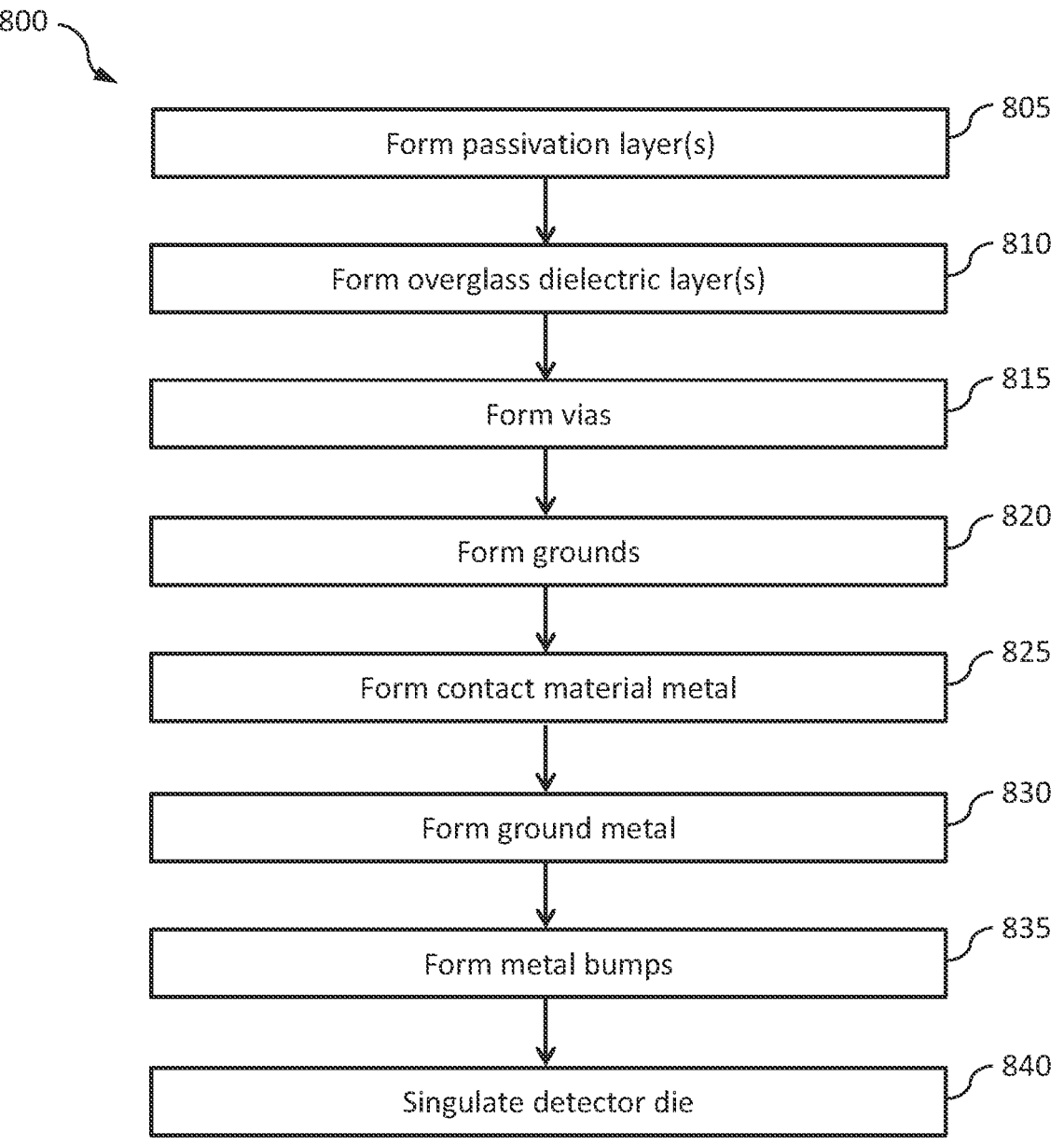
FIG. 8 illustrates a flow diagram of an example process for additional processing performed after the process of FIG. 4 to form detector pixels in accordance with one or more embodiments of the present disclosure.

In some embodiments, after the process 400 of FIG. 4, additional processing on the pixels 565A-C and/or other components of a detector circuit of the imaging system. FIG. 8 illustrates a flow diagram of an example process 800 for further processing to obtain a detector circuit in accordance with one or more embodiments of the present disclosure. For explanatory purposes, the process 800 is primarily described herein with reference to the pixels 565A-C of FIG. 5C. However, the process 800 can be performed in relation to other pixels. Note that one or more operations in FIG. 8 may be combined, omitted, and/or performed in a different order as desired.

One or more additional layers may be formed on the pixels 565A-C to provide surface passivation. At block 805, one or more passivation layers may be formed on the pixels 465A-C. The passivation layer(s) may be utilized to suppress surface leakage that may otherwise be created by dangling bonds on the surface of the detector mesas. For example, a passivation layer may be deposited to provide passivation for all exposed sidewall surfaces (e.g., along sidewalls formed by the gaps 535 and 550, such as sidewalls of the portions 540A-C and/or 555A-C and/or the etched absorber layer 560) after performing blocks 410 and 415. At block 810, an overglass dielectric layer is deposited after the passivation layer(s) has been deposited. In some cases, the overglass dielectric layer is omitted. In an aspect, the portions 555A-C of the barrier layer 525, the passivation layer(s), and the overglass dielectric layer (if deposited) may collectively provide passivation for the etched absorber layer 560.

Additional processing may be performed to provide contacts to allow the detector circuit to communicate with a readout circuit (e.g., an ROIC). At block 815, appropriate patterning and etching are performed to define vias in the passivation layer(s) and the overglass dielectric layer. At block 820, with the vias defined, appropriate patterning and etching are performed to define grounds. At block 825, appropriate patterning and deposition are performed to form contact material metal (e.g., also referred to as detector contacts). In some cases, the contact material metal may be provided at least on a surface of the portions 540A-C of the contact layer 530. At block 830, appropriate patterning and deposition are performed to form ground contact metal (e.g., also referred to as a ground contact). At block 835, appropriate patterning and deposition are performed to form metal bumps (e.g., indium bumps). In some cases, the detector circuit may be formed as part of a process that forms multiple detector circuits on a detector wafer. In such cases, at block 840, the detector die/wafer can be singulated to provide the detector circuit and one or more additional detector circuits. In an aspect, each detector circuit can be connected (e.g., hybridized) to a corresponding readout circuit (or portion thereof) by utilizing the metal bumps. In an aspect, the metal bumps may be, may include, or may be a part of the contacts 315 of FIG. 3. In some cases, the order of ground and contact metal deposition may be reversed or combined.

In some embodiments, during operation of the imaging system that includes the detector pixels (e.g., including the detector pixels formed by performing the process 400 and, in some cases, 800), the detector pixels may detect light 570 (e.g., incident light representing image data) and generate signals indicative of the light 570. Detector contacts may be connected to a ground contact and biased accordingly to facilitate readout of image data captured by the detector pixels. The generated signals may be read out by a readout circuit interconnected with the detector pixels of the detector circuit.

To generate signals based on the light 570, with reference to FIG. 5C, the substrate layer 505 provides a window to receive light 570. In an embodiment, the substrate layer 505 may prevent dark current while allowing transport of carriers. The buffer layer 510 disposed on the substrate layer 505 may facilitate reducing stress in subsequent layers of material formed on the substrate layer 505. The etched absorber layer 560 may absorb components of the light 570 received via the substrate layer 505 that have a wavelength below a cut-off wavelength of the etched absorber layer 560. In this regard, components of the light 570 having a wavelength below a cut-off wavelength of the substrate layer 505 is absorbed by the substrate layer 505 while the remaining components of the light 570 may be transmitted through the substrate layer 505 to be received by the etched absorber layer 560. The buffer layer 510 and the contact layer 515 may be of appropriate dimensions and material composition to allow the remaining components of the light 570 to be transmitted through the layers 505, 510, and 515 to be received by the etched absorber layer 560. In one non-limiting example, the cut-off wavelength of the substrate layer 505 may be around 0.9 μm, and the cut-off wavelength of the etched absorber layer 560 may be around 1.7 μm. In this example, the etched absorber layer 560 may absorb components of the light 570 having a wavelength between around 0.9 μm and 1.7 μm, since components having a wavelength less than around 0.9 μm are absorbed by the substrate layer 505.

In one aspect, the etched absorber layer 560 may have a superlattice structure (e.g., T2SL structure). The superlattice structure includes alternating layers of semiconductor materials that provide periodic quantum wells that create local confinement of carriers and an effective cut-off wavelength dependent on material composition and layer thicknesses. In some aspects, a thickness of the superlattice structure may be selected to provide a desired quantum efficiency. For example, a larger thickness of the superlattice structure is generally associated with more light (e.g., photons) being absorbed by the superlattice structure and higher quantum efficiency, but may exhibit issues associated with utilizing more material (e.g., higher costs, more defects) to form a thicker superlattice structure. Thicknesses of the superlattice structure may be selected to allow low dark current performance.

The barrier layer 525 disposed on the absorber layer 520 may act to block majority carrier current and passivate the etched absorber layer 560. The contact layer 530 disposed on the barrier layer 525 may connect or facilitate connection to the readout circuit and be utilized to provide passivation and suppress leakage current and dark current. Suppression of leakage current prevents signal leakage between detector pixels of the detector circuit.

In some aspects, the contact layers 515 and 530 may be utilized to facilitate biasing of the detector pixels. Metal layers (not shown) may be disposed on the contact layers 515 and 530 to form contacts of the detector pixels. As an example, in an nBn structure, photogenerated holes may flow to the contact layer 530 (thus allowing the photogenerated holes to be collected), while a flow of majority carrier dark current, reinjected photocurrent, and surface current are blocked. In this regard, the nBn detector is designed to reduce dark current (e.g., associated with Shockley-Read-Hall (SRH) processes) and noise without impeding photocurrent.

Figure 9:
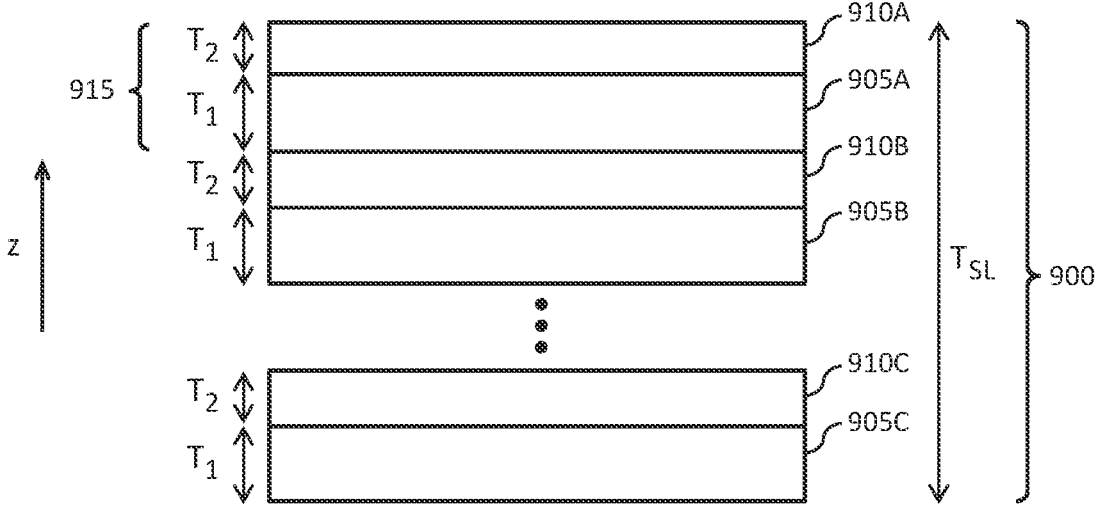
FIG. 9 illustrates an example superlattice structure in accordance with one or more embodiments of the present disclosure.

FIG. 9 illustrates an example superlattice structure 900 in accordance with one or more embodiments of the present disclosure. In some cases, the superlattice structure may be an SLS structure and/or a T2SL structure. The superlattice structure 900 includes layers 905A-C of a first semiconductor material and layers 910A-C of a second semiconductor material. In this regard, the superlattice structure 900 is formed of alternating layers of the first semiconductor material and the second semiconductor material. Each period of the superlattice structure 900 includes a layer of the first semiconductor material adjacent to a layer of the second semiconductor material. A period 915 is labeled. The period 915 includes the layer 905A adjacent to the layer 910A. For example, the layer 910A may be formed on (e.g., disposed on, epitaxially grown on) the layer 905A, or vice versa. The layers 905A-C and 910A-C may also be referred to as sub-layers of the superlattice structure 900.

The superlattice structure 900 has a thickness $T_{SL}$. Each layer of the first semiconductor material has a thickness $T_1$. Each layer of the second semiconductor material has a thickness $T_2$. The thickness $T_1$ may be referred to as a thickness of a layer of the first semiconductor material per period of the superlattice structure 900. Similarly, the thickness $T_2$ may be referred to as a thickness of a layer of the second semiconductor material per period of the second semiconductor material. The ellipses between the layers 905B and 910C indicate that one or more additional periods or no periods of alternating layers of first and second semiconductor material are provided between the layers 905B and 910C. In one example, the superlattice structure 900 has a thickness $T_{SL}$ approximately between 0.3 μm and 5 μm. In one example, each of the layers 905A-C and 910A-C has a thickness approximately between 5 Å and 100 Å. In FIG. 9, the thickness $T_1$ is lower than the thickness $T_2$. In other cases, the layers 910A-C may have the same thickness or be thicker than the layers 905A-C. For a given material composition of the first and second semiconductor materials, a bandgap (e.g., or equivalently the cut-off wavelength and cut-off frequency) of the superlattice structure 900 may be tuned by changing the thicknesses $T_1$ and/or $T_2$. The cut-off wavelength of the superlattice structure 900 can be tuned by changing the sub-layer thickness of the superlattice structure 900.

The superlattice structure 900 can be formed by selective deposition of thin layers of semiconductor materials in a stacked arrangement along the stacking direction (e.g., z-direction in FIG. 9). Periodic quantum wells create local confinement of carriers and an effective bandgap or cut-off wavelength dependent on the layer thicknesses. In some cases, the number of thin layers (e.g., number of periods) of the first and second semiconductor materials may depend on an absorption coefficient and carrier transport properties of an associated material system to effectuate a desired device quantum efficiency. The material system includes material composition of the first and second semiconductor material, associated layer dimensions, and additional layers disposed on the superlattice structure 900 and below the superlattice structure 900. In an embodiment, the first semiconductor material may be InGaAs and the second semiconductor material may be GaAsSb, or vice versa. In this embodiment, the superlattice structure 900 may be referred to as an InGaAs/GaAsSb superlattice structure.

The layer 910A is adjacent to and in contact with the layer 905A, the layer 905A is adjacent to and in contact with the layer 910B, the layer 910B is adjacent to and in contact with the layer 905B, and so forth. In one case, the layer 905C of the superlattice structure 900 may be a bottommost layer of the superlattice structure 900 onto which the layer 910C is disposed. The layer 910B may be disposed on the layer 905B, the layer 905A may be disposed on the layer 910B, and the layer 910A may be disposed on the layer 905A. In one aspect, layers of the superlattice structure 900 may be epitaxially grown. In this aspect, the layer 910C may be epitaxially grown on the layer 905C, the layer 910B may be epitaxially grown on the layer 905B, the layer 905A may be epitaxially grown on the layer 910B, and the layer 910A may be epitaxially grown on the layer 905A. The layers 905A-C and 910A-C may be formed using any suitable method. For example, each layer may be epitaxially grown using techniques such as molecular beam epitaxy (MBE), metalorganic chemical vapor deposition (MOCVD), and/or migration enhanced MOCVD (MEMOCVD). It is noted that the superlattice structure 900 of FIG. 9 illustrates one example superlattice structure. Other superlattice structure may be utilized. For example, although the superlattice structure 900 includes three periods, the superlattice structure 900 may include fewer (e.g., two) or more than three periods.

It is noted that dimensional aspects provided above are examples and that other values for the dimensions can be utilized in accordance with one or more implementations. Furthermore, the dimensional aspects provided above are generally nominal values. As would be appreciated by a person skilled in the art, each dimensional aspect has a tolerance associated with the dimensional aspect. Similarly, aspects related to distances between features also have associated tolerances.

Terms such as "top", "bottom", "front", "rear", "side", "horizontal", "vertical", and the like refer to an arbitrary frame of reference, rather than to the ordinary gravitational frame of reference. Thus, such a term may extend upwardly, downwardly, diagonally, or horizontally in a gravitational frame of reference.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. A method for fabricating pixels for a barrier detector, the method comprising:

forming a semiconductor structure for the barrier detector comprising a substrate layer, an absorber layer disposed on the substrate layer and configured to photo generate majority carriers and minority carriers, a barrier layer disposed on the absorber layer and configured to block the majority carriers and to pass the minority carriers, and a first contact layer disposed on the barrier layer; and forming the pixels from the semiconductor structure, wherein the forming the pixels comprises:

performing a first etching operation to remove a portion of at least the first contact layer;

performing a second etching operation to remove a portion of the barrier layer and a portion of the absorber layer, wherein, after the first etching operation and the second etching operation, a remaining portion of the barrier layer overlaps a remaining portion of a continuous absorber layer; and after the performing the first and second etching operations, forming a passivation layer on exposed surfaces of the contact layer, exposed surfaces of the barrier layer, and exposed surfaces of the continuous absorber layer, wherein each of the pixels comprises a respective portion of each of the substrate layer, the first contact layer, the barrier layer, and the absorber layer, and wherein the respective portion of the absorber layer of each of the pixels is a portion of the continuous absorber layer.

2. The method of claim 1, wherein the first and second etching operations define recesses in the semiconductor structure, and wherein a recess defined by the second etching operation has a smaller width than a recess defined by the first etching operation.

3. The method of claim 1, wherein the second etching operation is associated with removal of a smaller amount of material than the first etching operation.

4. The method of claim 1, wherein the performing the first and second etching operations collectively define a plurality of recesses that at least partially separate the pixels, wherein a portion of the passivation layer is formed within each of the plurality of recesses and each exposed surface of the contact layer, each exposed surface of the barrier layer, and each exposed surface of the continuous absorber layer is in contact with a respective portion of the passivation layer.

5. The method of claim 1, wherein the absorber layer comprises a Type-II superlattice structure.

6. The method of claim 1, wherein the performing of the first etching operation exposes a surface of the barrier layer.

7. The method of claim 1, wherein the performing of the first etching operation further removes a portion of the barrier layer.

8. The method of claim 1, wherein the first etching operation is performed before the second etching operation is performed.

9. The method of claim 1, wherein the second etching operation is performed before the first etching operation.

10. The method of claim 1, wherein the performing of the second etching operation further removes a portion of the first contact layer.

11. The method of claim 1, wherein the semiconductor structure further comprises a buffer layer disposed on the substrate layer and a second contact layer disposed on the buffer layer, and wherein the absorber layer is disposed on the second contact layer.

12. The method of claim 1, wherein the substrate layer is configured to receive electromagnetic radiation, and wherein the first contact layer is configured to be coupled to a readout circuit to allow readout of a signal indicative of the electromagnetic radiation.

13. The method of claim 1, wherein the forming the semiconductor structure comprises:

forming the substrate layer;

forming the absorber layer on the substrate layer;

forming the barrier layer on the absorber layer; and forming the contact layer on the barrier layer.

14. The method of claim 4, wherein each of the exposed surfaces of the first contact layer, the exposed surfaces of the barrier layer, and the exposed surfaces-of the absorber layer are exposed after the performing the first etching operation and/or the performing the second etching operation.

15. The method of claim 1, wherein the first etching operation removes a portion of only the first contact layer.

* * * * *